(12) United States Patent
Park et al.

(10) Patent No.: US 7,951,720 B2
(45) Date of Patent: May 31, 2011

(54) METHOD OF FORMING A CONTACT HOLE FOR A SEMICONDUCTOR DEVICE

(75) Inventors: Jun Hyung Park, Gyeonggi-do (KR); Ki Sung Kwon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/493,714

(22) Filed: Jun. 29, 2009

(65) Prior Publication Data
US 2010/0062605 A1   Mar. 11, 2010

(30) Foreign Application Priority Data
Sep. 9, 2008   (KR) .................. 10-2008-0088665

(51) Int. Cl.
*H01L 21/308* (2006.01)
(52) U.S. Cl. ................ 438/703; 257/E21.232
(58) Field of Classification Search .................. 438/703, 438/763; 257/E21.232; 427/99.2
See application file for complete search history.

(56) References Cited

U.S. PATENT DOCUMENTS
2009/0263628 A1 * 10/2009 Millward ...................... 428/173

FOREIGN PATENT DOCUMENTS
| KR | 1020060047051 A | 5/2006 |
| KR | 1020060054666 A | 5/2006 |
| KR | 10-0618850 B1 | 8/2006 |

OTHER PUBLICATIONS

Quirk M. and Serda J. "Eigth Basic Steps of Photolithography." Semiconductor Manufacturing Technology, Prentice-Hall 2001 p. 342-345.*

* cited by examiner

*Primary Examiner* — Matthew S Smith
*Assistant Examiner* — Daniel Shook
(74) *Attorney, Agent, or Firm* — Ladas & Parry LLP

(57) ABSTRACT

Forming contact holes of a semiconductor device includes forming a reaction layer that is provided with a reaction pattern on a semiconductor substrate. Subsequently, a self-assembled monolayer is formed by injecting a polymer from a functional group that is capable of being chemically bonded to the reaction pattern. A coating layer is then formed on substantially all of the structure that includes the self-assembled monolayer. Afterwards, the contact holes are formed on the semiconductor substrate by performing an etching process.

8 Claims, 2 Drawing Sheets

METHOD OF FORMING A CONTACT HOLE FOR A SEMICONDUCTOR DEVICE

CROSS-REFERENCES TO RELATED PATENT APPLICATION

The present application claims priority under 35 U.S.C 119(a) to Korean Application No. 10-2008-0088665, filed on Sep. 9, 2008, in the Korean Intellectual Property Office, which is incorporated herein by reference in its entirety as set forth in full.

BACKGROUND

The embodiment described herein relate to a method for manufacturing a semiconductor device, and more specifically, to a method for forming a contact hole of a semiconductor device.

High storage density, rapid operation rates, non-volatility, low production cost, and low power consumption, all of which are important development factors of semiconductor memory devices. In order to satisfy these conditions, the size of the semiconductor memory device is increasingly reduced, and thus it is important to form highly resolved contact holes with uniform diameter throughout the length of the holes.

In particular, manufacturing a phase-change random access memory (PRAM) device involves processes for forming highly resolved contact holes in a high density configuration. However, problems occur using conventional methods of forming contact holes in a high density configuration because the holes are not fully opened. For example, a bridge may occur.

The formation of contact holes with an increased depth using conventional methods also results in a difference between the upper and lower diameter of each hole, thus reducing the performance of the device.

Further, another problem with the conventional methods of creating a high density configuration of contact holes arises when the intervals between the contact holes are reduced. The desired number of contact holes cannot be formed in a single process. Accordingly, the process for forming the contact holes must be repeated several times, thus increasing the number of steps of the process.

SUMMARY

Embodiments of the present invention are directed to a method for forming contact holes of a semiconductor device comprised of simultaneously forming highly resolved contact holes in a high density configuration.

Additionally, embodiments of the present invention are directed to a method for forming highly resolved contact holes in a dense arrangement without error.

In one embodiment, a method for forming contact holes of a semiconductor device includes forming a reaction layer that is formed by a reaction pattern on a semiconductor substrate; forming a self-assembled monolayer by injecting a functional group that is capable of being chemically bonded to the reaction pattern; forming a coating layer on substantially all of an entire structure that is configured to include the self-assembled monolayer; and forming the contact holes on the semiconductor substrate by performing an etching process.

In another embodiment, a method for forming a contact hole of a semiconductor device, comprising: providing a semiconductor substrate; forming a reaction layer on the semiconductor substrate, the reaction layer having a column formed thereon and protruding away from the reaction layer; forming a coating layer on the reaction layer including the column so as to encapsulate the column, wherein the column comprises a material having a higher etching rate than that of the coating layer; and etching the substrate including the reaction layer, coating layer, and column to form the contact hole.

These and other features, aspects, and embodiments are described below in the "Description of Specific Embodiments."

BRIEF DESCRIPTION OF THE DRAWINGS

It is understood herein that the drawings are not necessarily to scale and in some instances proportions may have been exaggerated in order to more clearly depict certain features of the invention.

DESCRIPTION OF SPECIFIC EMBODIMENTS

Hereinafter, the preferred embodiments will be described in detail with reference to the accompanying drawings.

FIGS. 1 to 5 are cross-sectional views that show a method for forming a contact hole of a semiconductor device according to the embodiment.

Figure 1:
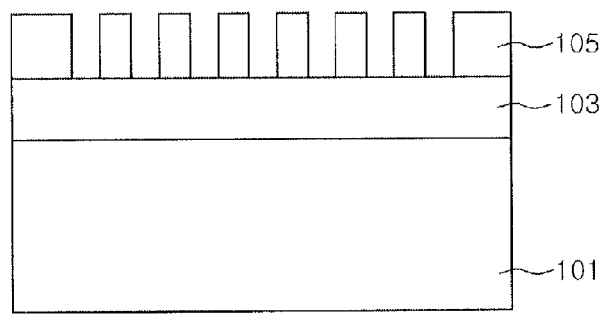
FIGS. 1 to 5 are cross-sectional views illustrating a method for forming a contact hole of a semiconductor device in accordance with an embodiment.

As shown in FIG. 1, a mask 105 is formed on a reaction layer 103 that is formed on a semiconductor substrate 101, constituting a lower structure. Mask 105 exposes regions where the contact hole will be formed.

Herein, the reaction layer 103 can be subjected to surface reformation and may be formed by using any polymer in a chemical functional group that is capable of being chemically bonded.

Figure 2:
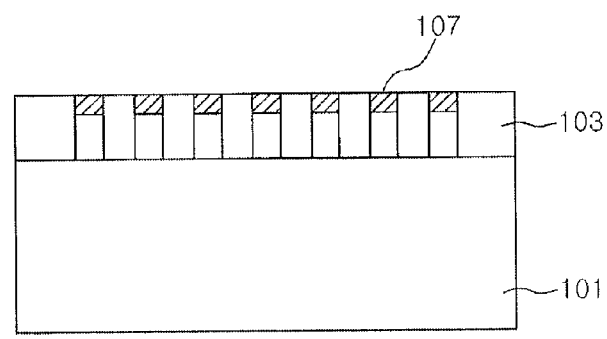

Subsequently, as shown in FIG. 2, exposure and post exposure bake processes are performed, such that a reaction pattern 107 is formed on the exposure portion of the reaction layer 103, and mask 105 is removed. Herein, the reaction pattern 107 may be formed on at least a portion of the surface of the reaction layer 103.

Due to the exposure and post exposure bake processes, the reaction pattern 107 has an acidic molecular structure, and the reaction pattern 107 is converted into any one of the functional groups that are capable of being chemically bonded, such as, but not limited to, a carboxyl group, an amine group, a sulfide group, according to the material thereof.

Figure 3:
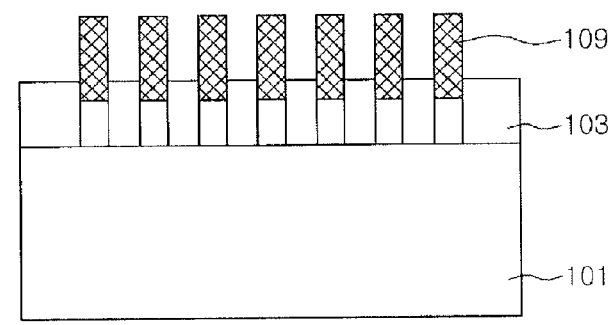

As shown in FIG. 3, the functional groups that are capable of being chemically bonded to a chemical group that constitutes the reaction pattern 107 are injected, such that a self-assembled monolayer (SAM) 109 is formed.

It is understood that self-assembling is a phenomenon where unit molecules are assembled through interaction between molecules, such that a predetermined structure is formed. Self-assembling is mainly used to manufacture a nanodevice by using a bottom-up method. Using this principle in conjunction with a regularly arranged organic molecular film forms the self-assembled monolayer 109.

In one embodiment, an amine group may be injected when the reaction pattern 107 is configured to include a carboxyl group, such that peptide bonds can be induced. Then, another member of a functional group that can be chemically bonded to the amine group is injected, such that the self-assembled monolayer 109 can be configured in a plurality of layers.

Figure 4:
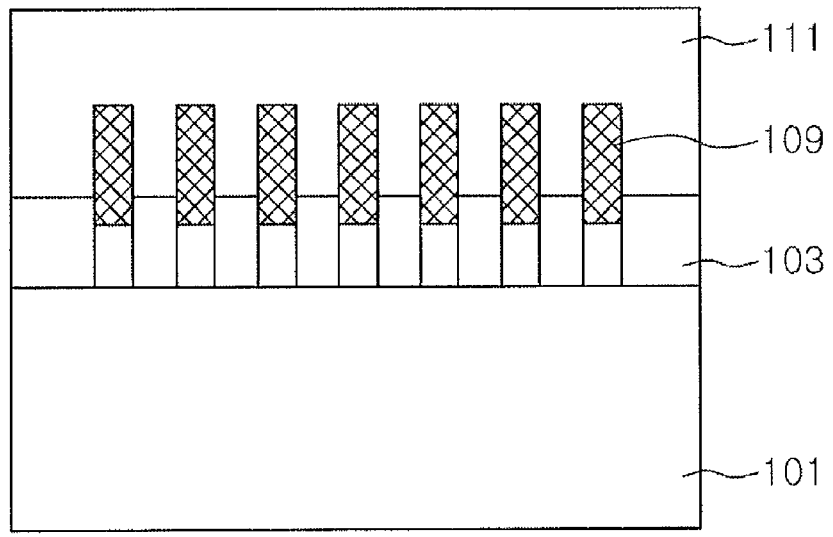

As shown in FIG. 4, after the self-assembled monolayer 109 is formed, a coating layer 111 is formed on substantially all of the entire structure. Herein, the coating layer 111 can be formed of a spin on glass (SOG) layer.

Figure 5:
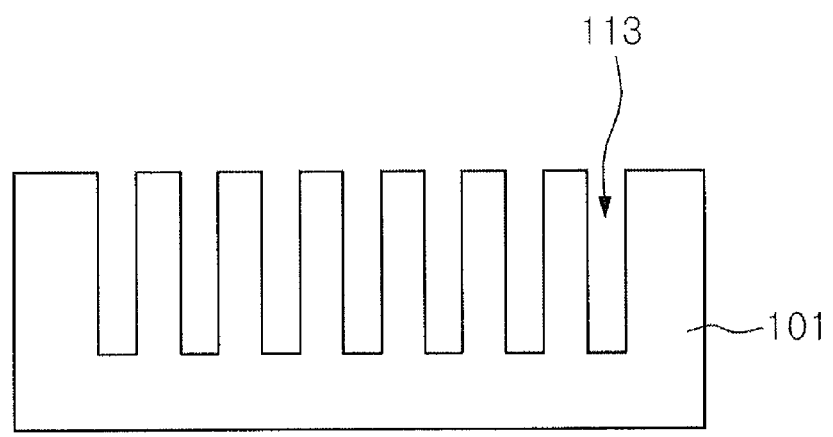

Afterwards, an etching process is performed, such that a contact hole 113 is formed on the semiconductor substrate 101, as shown in FIG. 5. The density is low at this time, because the self-assembled monolayer 109 is organic. Thus, the self-assembled monolayer 109 is etched at a rate that is higher than those of the coating layer 111, the reaction layer 103, and the semiconductor substrate 101. Thus, the contact hole 113 is formed on the semiconductor substrate 101.

As described above, highly resolved contact holes in a high density configuration can be formed by forming the high density, self-assembled monolayer on the semiconductor substrate and forming the contact hole by using the difference in the etching rate.

While specific embodiments have been described above, those embodiments described are by way of example only. Accordingly, the device and method are not limited to the described embodiments, and the devices and methods described herein are only limited in light of the claims that follow when taken in conjunction with the above description and accompanying drawings.

What is claimed is:

1. A method for forming a contact hole of a semiconductor device, comprising:
    forming a reaction layer on a semiconductor substrate;
    forming a mask on the reaction layer, the mask being formed to have openings exposing a portion of the reaction layer corresponding to a region on which the contact hole will be formed;
    forming the reaction pattern on the exposed portion of the reaction layer by performing an exposure process and a post exposure bake process;
    removing the mask;
    forming a self-assembled monolayer having a column shape protruding away from the reaction layer by injecting a functional group that chemically bonds to the reaction pattern;
    forming a coating layer as a sacrificial layer over the self-assembled monolayer and the reaction layer; and
    forming the contact hole in the semiconductor substrate by performing a blanket etching process on the semiconductor substrate having the coating layer, the self-assembled monolayer, and the reaction layer formed thereon.

2. The method for forming a contact hole of a semiconductor device of claim 1, wherein the reaction layer is formed by using a polymer in a chemical functional group that is capable of being chemically bonded.

3. The method for forming a contact hole of a semiconductor device of claim 1, wherein the reaction layer is formed by using any polymer that is capable of being subjected to surface reformation.

4. The method for forming a contact hole of a semiconductor device of claim 1, wherein the reaction pattern has an acidic molecular structure.

5. The method for forming a contact hole of a semiconductor device of claim 1, wherein the reaction pattern is converted into any one of the functional groups of a carboxyl group, an amine group, or a sulfide group.

6. The method for forming a contact hole of a semiconductor device of claim 1, wherein there is a plurality of the self-assembled monolayers.

7. The method for forming a contact hole of a semiconductor device of claim 1, wherein the coating layer is a Spin on Glass (SOG) layer.

8. The method for forming a contact hole of a semiconductor device of claim 1, wherein the self-assembled monolayer comprises a material having a higher etching rate than that of the coating layer, the reaction layer, and the semiconductor substrate.

* * * * *